(12) United States Patent
Kim et al.

(10) Patent No.: US 12,032,019 B2
(45) Date of Patent: Jul. 9, 2024

(54) CLOCK CONVERSION DEVICE, TEST SYSTEM HAVING THE SAME, AND METHOD OF OPERATING TEST SYSTEM

(71) Applicant: Samsung Electronics Co., Ltd., Suwon-si (KR)

(72) Inventors: Yongjeong Kim, Cheonan-si (KR); Jongjin An, Asan-si (KR); Seonggwon Jang, Asan-si (KR); Pilho Lee, Asan-si (KR); Inhoon Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 202 days.

(21) Appl. No.: 17/582,385

(22) Filed: Jan. 24, 2022

(65) Prior Publication Data
US 2022/0404417 A1    Dec. 22, 2022

(30) Foreign Application Priority Data

Jun. 22, 2021 (KR) .................... 10-2021-0081050

(51) Int. Cl.
*G01R 31/3177* (2006.01)
*G01R 31/28* (2006.01)
(Continued)

(52) U.S. Cl.
CPC ..... *G01R 31/3177* (2013.01); *G01R 31/2834* (2013.01); *G01R 31/3004* (2013.01); *G01R 31/31727* (2013.01); *G01R 31/31924* (2013.01); *H03K 3/017* (2013.01); *H03K 19/21* (2013.01); *H03L 7/099* (2013.01); *H01L 22/34* (2013.01);
(Continued)

(58) Field of Classification Search
CPC .......... G01R 31/3177; G01R 31/31727; G01R 31/31922; G01R 31/31725; G01R 31/31924; G01R 31/2834; G01R 31/3004; H03K 3/017; H03K 19/21; H03K 5/00006; H03K 5/1565; H03L 7/099; H03L 7/183; H03L 7/0812; G11C 29/56012;
(Continued)

(56) References Cited

U.S. PATENT DOCUMENTS 6,385,125 B1    5/2002    Ooishi et al.
7,007,188 B1    2/2006    Tischler et al.
(Continued)

FOREIGN PATENT DOCUMENTS

KR        101082426 B1    11/2011
KR    10-2020-0054003 A    5/2020

*Primary Examiner* — Raul J Rios Russo
(74) *Attorney, Agent, or Firm* — Harness, Dickey & Pierce, P.L.C.

(57) ABSTRACT

Provided are a clock conversion device, a test system including the same, and a method of operating the test system. The clock conversion device includes a first clock generator configured to receive a first input clock signal from test logic and generate a first clock signal of which a frequency is multiplied and a phase is locked; a clock conversion circuit configured to receive the first clock signal and generate one or more second clock signals by converting at least one clock characteristic of the first clock signal; and an output selector configured to output any one of the first clock signal and the one or more second clock signals as an output clock signal, wherein the clock conversion device is configured to provide the output clock signal to a device under test (DUT).

20 Claims, 10 Drawing Sheets

(51) Int. Cl.
*G01R 31/30* (2006.01)
*G01R 31/317* (2006.01)
*G01R 31/319* (2006.01)
*H01L 21/66* (2006.01)
*H03K 3/017* (2006.01)
*H03K 19/21* (2006.01)
*H03L 7/099* (2006.01)

(52) U.S. Cl.
CPC .. *H01L 2924/00* (2013.01); *H01L 2924/0002* (2013.01)

(58) Field of Classification Search
CPC ............... G11C 7/222; H01L 2924/00; H01L 2924/0002; H01L 22/34
USPC ..................................................... 324/750.01
See application file for complete search history.

(56) References Cited

U.S. PATENT DOCUMENTS

| | | | |
|---|---|---|---|
| 9,088,399 B1 | 7/2015 | Poon et al. | |
| 9,838,165 B2 | 12/2017 | Schuttert et al. | |
| 2008/0234961 A1* | 9/2008 | Tanaka | G01R 31/31922 702/82 |
| 2015/0168992 A1* | 6/2015 | Choi | H03K 19/017509 327/108 |
| 2016/0011259 A1* | 1/2016 | Litovchenko | G01R 31/31721 714/733 |
| 2018/0080987 A1* | 3/2018 | Srinivasan | G01R 31/31724 |
| 2018/0123574 A1* | 5/2018 | Ma | G11C 8/10 |
| 2019/0120901 A1* | 4/2019 | Chen | G01R 31/31705 |
| 2020/0150711 A1 | 5/2020 | Kim et al. | |

* cited by examiner

CLOCK CONVERSION DEVICE, TEST SYSTEM HAVING THE SAME, AND METHOD OF OPERATING TEST SYSTEM

CROSS-REFERENCE TO RELATED APPLICATION

This application is based on and claims priority under 35 U.S.C. § 119 to Korean Patent Application No. 10-2021-0081050, filed on Jun. 22, 2021, in the Korean Intellectual Property Office, the disclosure of which is incorporated by reference herein in its entirety.

BACKGROUND

The inventive concepts relate to a clock conversion device, and more particularly, to a clock conversion device capable of providing various types of clock signals to a device under test (DUT), a test system including the clock conversion device, and a method of operating the test system.

A memory device may receive commands, addresses, and data from external devices. During a process for mass production of memory devices, a memory device may be tested as a DUT, and, as the speed of a memory device may be increased and various tests related to the memory device may be performed, various types of clock signals may be needed in the process of testing a memory device.

However, an existing test system for testing a memory device may exhibit a lower operating speed as compared to the operating speed of a memory device, and there may be limits for providing various types of clock signals in correspondence to various types of tests on a memory device.

SUMMARY

The inventive concepts provide a clock conversion device capable of supporting various types of tests on a memory device operating at a higher speed, a test system including the clock conversion device, and a method of operating the test system.

According to an aspect of the inventive concepts, there is provided a clock conversion device including a first clock generator configured to receive a first input clock signal from test logic and generate a first clock signal of which a frequency is multiplied and a phase is locked; a clock conversion circuit configured to receive the first clock signal and generate one or more second clock signals by converting at least one clock characteristic of the first clock signal; and an output selector configured to output any one of the first clock signal and the one or more second clock signals as an output clock signal, wherein the clock conversion device is configured to provide the output clock signal to a device under test (DUT).

According to another aspect of the inventive concepts, there is provided a test system including a plurality of sockets to which a plurality of devices under test (DUTs) are mounted; and a clock conversion device configured to generate output clock signals to be provided to the DUTs, convert clock characteristics of the output clock signals, and output the output clock signals, wherein the clock conversion device includes a first clock generator configured to receive a first input clock signal and a second input clock signal from the outside and generate a first clock signal with a multiplied frequency through a calculation process on the first input clock signal and the second input clock signal; a second clock generator configured to receive the first input clock signal and generate a second clock signal of which a frequency is multiplied and a phase is locked; a clock conversion circuit configured to receive the second clock signal and generate one or more third clock signals by converting at least one clock characteristic of the second clock signal; and an output selector configured to output any one of the first clock signal, the second clock signal, and the one or more third clock signals as the output clock signal.

According to another aspect of the inventive concepts, there is provided a method of operating a test system including a clock conversion device configured to provide an output clock signal to a device under test (DUT), the method including performing a first test operation by providing a first clock signal, of which a frequency is multiplied and a phase is locked by the clock conversion device, to the DUT as the output clock signal; performing a second test operation by providing a second clock signal generated by the clock conversion device by adjusting a duty ratio of the first clock signal to the DUT as the output clock signal; and performing a third test operation by providing a third clock signal generated by the clock conversion device by maintaining a level of the first clock signal or the second clock signal at a fixed level for some periods to the DUT as the output clock signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
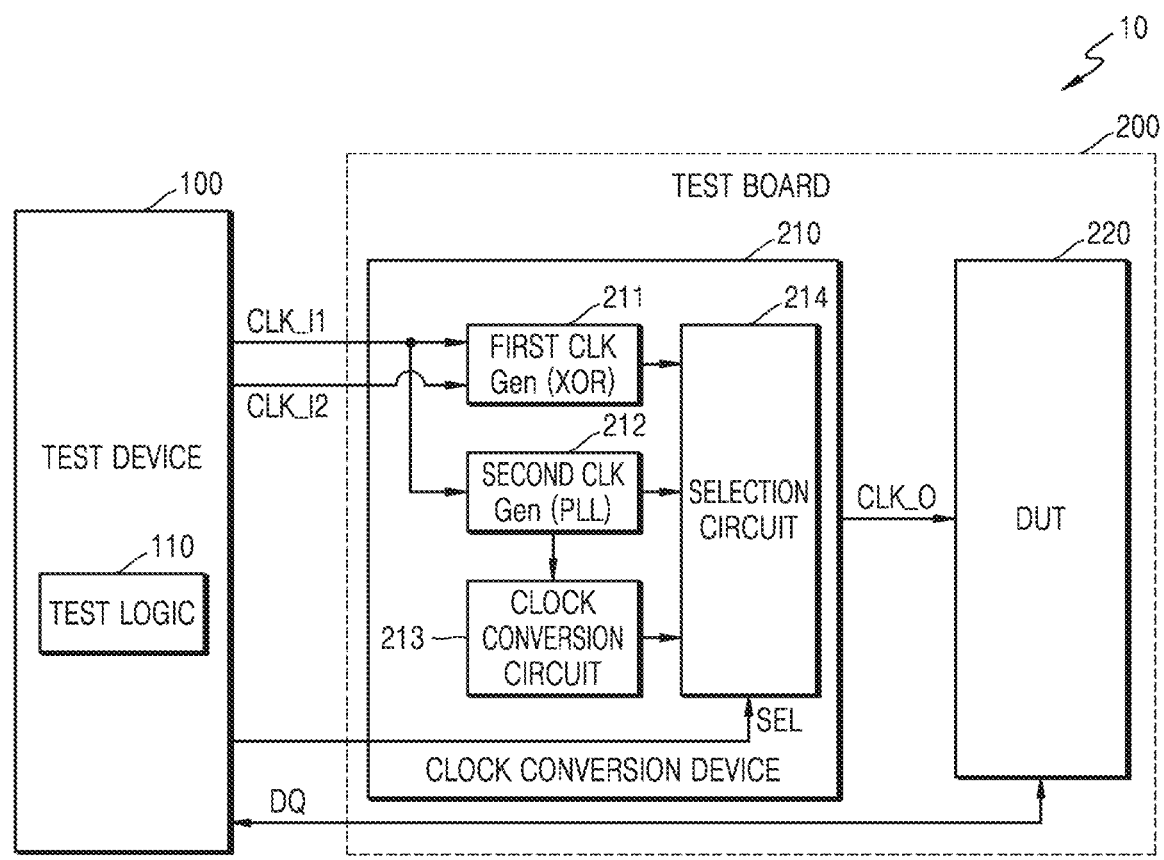
FIG. 1 is a block diagram showing a test system according to example embodiments of the inventive concepts.

FIG. 1 is a block diagram showing a test system according to example embodiments of the inventive concepts.

Referring to FIG. 1, a test system 10 for testing various types of semiconductor devices like a memory device may include a test device 100 and a test board 200 on which one or more devices under test (DUTs) 220 to be tested are mounted. Also, in relation to a test operation, various components may be provided on the test board 200. For example, the test board 200 may include a plurality of sockets (not shown) to which DUTs are attached, and the DUTs 220 may be attached to the sockets. Although FIG. 1 shows one DUT for convenience of explanation, a plurality of sockets may be provided in the test board 200, and a plurality of DUTs may be attached to the sockets and may be tested together or simultaneously. Also, the test board 200 may be referred to as a socket board for including a plurality of sockets.

According to various example embodiments, as the test device 100 is provided outside the test board 200, the test device 100 may communicate with the DUT 220 through the test board 200. In other words, because the test device 100 and the test board 200 constitute the test system 10 and the DUT 220 is provided outside the test board 200, the DUT 220 communicates with the test device 100 through the test board 200.

The test device 100 may include test logic 110 for controlling the overall test operation regarding the DUT 220. Although not shown in FIG. 1, the test device 100 may further include various other components (not shown) like a communication device for communicating with an external host requesting a test, a memory for temporarily storing various information related to various tests, an interface circuit to communicate with the DUT 220, and a power supply circuit for supplying power to the DUT 220. According to example embodiments, the test device 100 may include a semiconductor chip like a field programmable gate array (FPGA), an application specific integrated circuit (ASIC), and an application processor (AP), and the semiconductor chip may performed the function of the test logic 110.

A test operation for determining whether a semiconductor device is defective may be performed in various stages of a semiconductor manufacturing process. For example, a test operation according to example embodiments of the inventive concepts may be a test on a semiconductor package in which one semiconductor die (or a semiconductor chip) is packaged. Alternatively, a test on a semiconductor package may be a test on a semiconductor package including a plurality of semiconductor chips.

In addition, the DUT 220 may include various types of semiconductor devices, e.g., a memory device including a memory cell array. For example, the memory device may include dynamic random access memory (DRAM) like double data rate synchronous dynamic random access memory (DDR SDRAM), low power double data rate LPDD(LPDDR) SDRAM, graphics double data rate (GDDR) SDRAM, and Rambus dynamic random access memory (RDRAM). Alternatively, the memory device may include a non-volatile memory like flash memory, magnetic RAM (MRAM), ferroelectric RAM (FRAM), phase change RAM (PRAM), and resistive RAM (ReRAM).

According to example embodiments of the inventive concepts, the test board 200 may include a clock conversion device 210. For example, the clock conversion device 210 may be implemented as a semiconductor chip and mounted on the test board 200. For example, the test board 200 may include a printed circuit board (PCB) that transmits various signals from the test device 100 to the DUT 220 and the clock conversion device 210 may be mounted on the PCB to receive an input clock signal from the test device 100 and provide one or more output clock signals generated through a signal conversion operation to the DUT 220.

The clock conversion device 210 may provide clock signals having various clock characteristics (or frequency characteristics) to the DUT 220 based on a clock generation operation and/or a clock conversion operation. Through a conversion operation on a clock signal provided from the outside (e.g., the test device 100) (hereinafter referred to as an input clock signal), the clock conversion device 210 may provide one or more clock signals having different clock characteristics from that of the input clock signal (hereinafter, referred to as output clock signals) to the DUT 220. In the example embodiments below, clock characteristics may include various characteristics related to the waveform of a clock signal, e.g., a frequency, a duty ratio (or a duty cycle), and a clock activation state of the clock signal.

For example, the clock conversion device 210 may receive one or more clock signals from the test device 100, e.g., a first input clock signal CLK_I1 and a second input clock signal CLK_I2. Also, the first input clock signal CLK_I1 and the second input clock signal CLK_I2 may have the same frequency and opposite phases.

The clock conversion device 210 may include a first clock generator 211, a second clock generator 212, a clock conversion circuit 213, and/or a selection circuit 214. The first clock generator 211 may generate a clock signal by increasing the frequency of an input clock signal by a fixed multiple degree, and the second clock generator 212 may generate a clock signal by increasing the frequency of the input clock signal by a variable multiple degree. For example, the first clock generator 211 may generate a clock signal having a frequency that is twice the frequency of the first input clock signal CLK_I1 or the second input clock signal CLK_I2, and the second clock generator 212 may generate a clock signal that is increased by various multiples, e.g., two times, four times, eight times, etc., as compared to the frequency of the first input clock signal CLK_I1 or the second input clock signal CLK_I2.

For example, the first clock generator 211 may receive the first input clock signal CLK_I1 and the second input clock signal CLK_I2 and perform calculations thereon, thereby generating a first clock signal having a predetermined or alternatively, desired frequency. For example, the first clock generator 211 may include a calculator that performs various types of calculations regarding an input signal, and FIG. 1 exemplifies an exclusive OR (XOR) calculator that performs an XOR calculation regarding the first input clock signal CLK_I1 and the second input clock signal CLK_I2. Through the XOR calculation, the first clock generator 211 may output the first clock signal having a frequency that is twice (×2) the frequency of the first input clock signal CLK_I1 or the second input clock signal CLK_I2.

The second clock generator 212 may include a phase locked loop (PLL) circuit, wherein the PLL circuit may include one or more voltage-controlled oscillators (not shown). For example, as the PLL circuit includes a plurality of voltage-controlled oscillators, the second clock generator 212 may generate a clock signal (e.g., the second clock signal) of which the frequency is increased by various multiples. For example, the second clock generator 212 may receive any one of the first input clock signal CLK_I1 and the second input clock signal CLK_I2 (e.g., the first input clock signal CLK_I1) and generate the second clock signal having a frequency increased as compared to that of the first input clock signal CLK_I1.

According to example embodiments of the inventive concepts, the clock conversion circuit 213 may receive the second clock signal from the second clock generator 212 and adjust the clock characteristic of the second clock signal including a frequency and a duty in various ways, thereby generating one or more clock signals. For example, the clock conversion circuit 213 may include a duty cycle distortion (DCD) control circuit for adjusting the duty of the second clock signal, thereby controlling the duty of the second clock signal. Also, the clock conversion circuit 213 may include a suspend control circuit for constantly maintaining the level of the second clock signal, thereby performing a converting operation for maintaining the level of the second clock signal at a logic high level or a logic low level. Also, the clock conversion circuit 213 may include a frequency control circuit that changes the frequency of an output clock signal. For example, the clock conversion circuit 213 may include a half clock control circuit that outputs a signal having a frequency of a ½ (or a half band) as compared to the frequency of a phased-locked signal of the PLL circuit. Also, for example, the half clock control circuit may perform a conversion operation, such that only clocks of a predetermined or alternatively, desired number have frequencies in the half band. For example, the half clock control circuit may output a clock signal in which frequencies of two clocks are reduced to the half band.

By adjusting clock characteristics as described above, the clock conversion circuit 213 may output one or more third clock signals, wherein a third clock signal may include a signal generated by converting at least one of various types of clock characteristics described above. For example, the third clock signal may have a clock characteristic that a phase-locked second clock signal of the PLL circuit maintains a suspended state, the duty ratios of clocks are adjusted in some other periods, or the frequency of the third clock signal is decreased as compared to the frequency band of the second clock signal in some other periods.

The selection circuit 214 may receive first to third clock signals and, in response to the selecting signal SEL from the test logic 110, output any one clock signal as an output clock signal CLK_O. The output clock signal CLK_O may be provided to the DUT 220. The DUT 220 may receive the output clock signal CLK_O and perform various operations based on the same. For example, the DUT 220 may transmit and receive data DQ corresponding to a test pattern to and from the test device 100, wherein the DUT 220 may transmit and receive the data DQ in response to the output clock signal CLK_O. For example, when the DUT 220 includes GDDR standard DRAM, the DUT 220 may receive the output clock signal CLK_O as a write clock signal (a WCK signal according to the JEDEC standard). For example, when the DUT 220 includes LPDDR standard DRAM, the DUT 220 may receive the output clock signal CLK_O as a data strobe signal (a DQS signal according to the JEDEC standard). Alternatively, according to example embodiments, the DUT 220 may receive the output clock signal CLK_O through the clock conversion device 210, but the DUT 220 may receive the data DQ directly from the test device 100 through wires and sockets arranged on the test board 200.

According to example embodiments of the inventive concepts, even when the bandwidth of clock signals that may be provided by the test logic 110 is limited to x Gbps (e.g., x is an integer), as various clock generating circuits and clock converting circuits are stacked on the test board 200, broadband output clock signals (e.g., from 0 Gbps to 32 Gbps) may be provided to the DUT 220. For example, the first clock generator 211 may perform an XOR calculation on a received clock signal in real time, thereby generating a first clock signal with reduced or minimized delay. Also, because the second clock generator 212 includes the PLL circuit, the second clock generator 212 may generate a second clock signal from which noise is reduced or removed. Also, the clock characteristic of an output signal of the PLL circuit is unchangeable after a phase is locked. However, according to example embodiments of the inventive concepts, by integrating various circuits for adjusting various clock characteristics of an output signal of the PLL circuit, the duty of the output signal of the PLL circuit may be adjusted, the level of the output may be changed to a fixed level, or the frequency of the output signal may be changed (e.g., change to a clock having a lower frequency), thereby providing output clock signals having various clock characteristics to the DUT 220. Therefore, various tests may be performed on the DUT 220.

Figure 2:
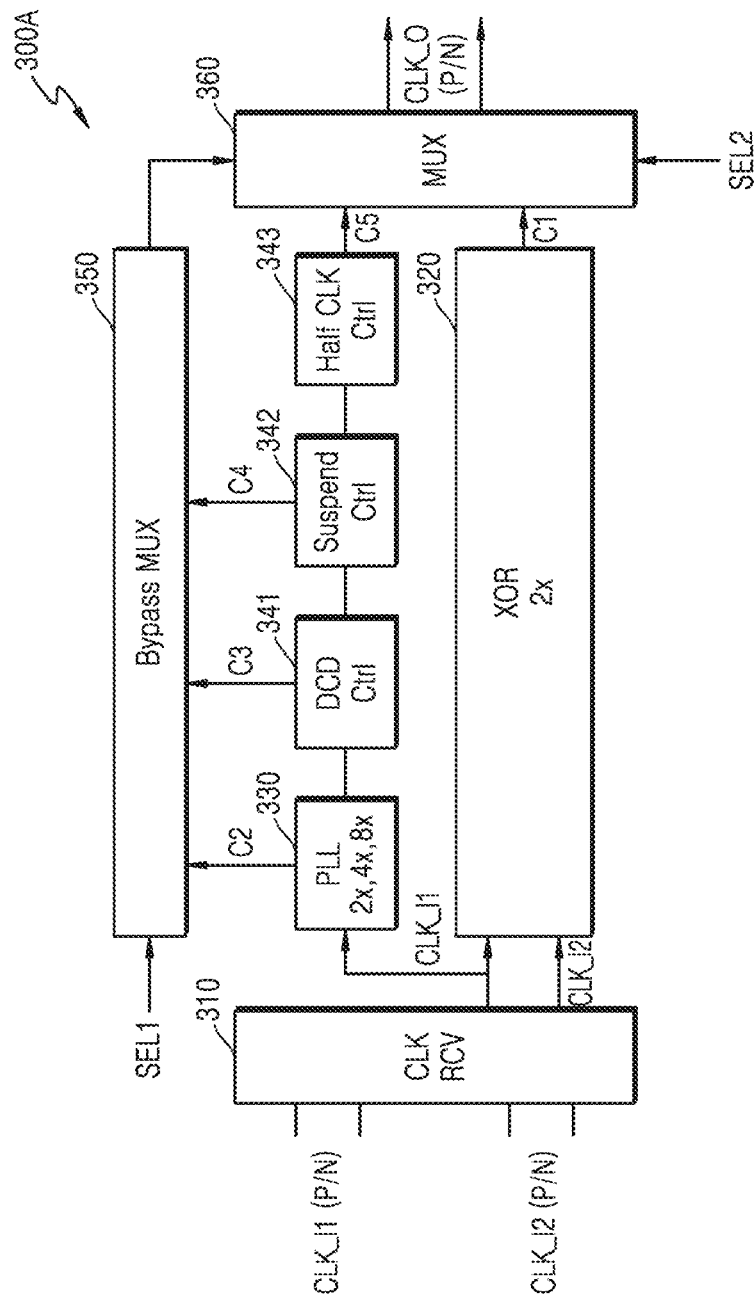
FIG. 2 is a block diagram showing a clock conversion device according to example embodiments of the inventive concepts.

FIG. 2 is a block diagram showing a clock conversion device according to example embodiments of the inventive concepts.

Referring to FIG. 2, a clock conversion device 300A may include a clock receiver 310, an XOR circuit 320 as a first clock generator, and/or a PLL circuit 330 as a second clock generator. Also, the clock conversion device 300A may include a clock conversion circuit according to the example embodiments described above, and the clock conversion circuit may include a DCD control circuit 341, a suspend control circuit 342, and/or a half clock control circuit 343. Also, the clock conversion device 300A may further include a bypass selector 350 for selecting bypass of clock signals and an output selector (or multiplexer) 360 for selecting a clock signal to be provided to a DUT from among various types of clock signals generated in the clock conversion device 300A.

FIG. 2 shows example embodiments in which, because each clock signal includes a differential signal, two lines for transmitting signals having opposite phases are arranged for each clock signal. Also, FIG. 2 shows that an output from the PLL circuit 330 is sequentially provided to the DCD control circuit 341, the suspend control circuit 342, and the half clock control circuit 343, but example embodiments of the inventive concepts are not necessarily limited to. For example, in the example embodiments of FIG. 2, the suspend control circuit 342 and the half clock control circuit 343 may each receive an output from the PLL circuit 330 directly and change clock characteristic of the output. Alternatively, an output from the PLL circuit 330 may be transmitted to circuit blocks for changing clock characteristics in an order different from that shown in FIG. 2 and clock characteristics thereof may be changed.

Also, FIG. 2 shows example embodiments in which the clock conversion device 300A includes all of the DCD control circuit 341, the suspend control circuit 342, and the half clock control circuit 343, but example embodiments of the inventive concepts are not necessarily limited thereto. For example, considering the type of a DUT to perform a test and operations to perform a test, the clock conversion device 300A may include some circuit blocks from among the DCD control circuit 341, the suspend control circuit 342, and the half clock control circuit 343 or may further include other clock conversion circuits. Also, FIG. 2 shows example embodiments in which the DCD control circuit 341, the suspend control circuit 342, and the half clock control circuit 343 are implemented as separate circuit blocks, circuits may also be configured to process conversion of at least two clock characteristics through one circuit block.

An example operation of the clock conversion device 300A according to example embodiments of the inventive concepts will be described below. In the example embodiments below, generation of various clock signals and a control operation for controlling the same may be performed by a hardware circuit, software, or a combination thereof.

FIGS. 4 to 7B are waveform diagrams showing various clock signals output from the clock conversion circuit shown in FIG. 2. Referring to FIGS. 2 to 7B, the clock receiver 310 may receive one or more clock signals respectively corresponding to differential signals. For example, the clock receiver 310 may receive the first input clock signal CLK_I1 and the second input clock signal CLK_I2. As the first input clock signal CLK_I1 and the second input clock signal CLK_I2 are implemented as differential signals, respectively, for example, the first input clock signal CLK_I1 may include a positive signal P and a negative signal N having phases opposite to each other. Also, the output clock signal CLK_O output from the clock conversion device 300A may also include a positive signal P and a negative signal N.

Figure 4:
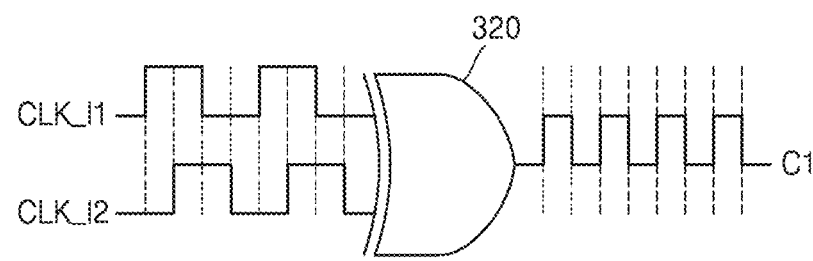
FIGS. 4 to 7B are waveform diagrams showing various clock signals output from the clock conversion circuit shown in FIG. 2.

FIG. 4 is a diagram showing an example of a first clock signal C1 output from the XOR circuit 320. The XOR circuit 320 may change the frequency band of an input clock signal. For example, the XOR circuit 320 may perform an XOR calculation on the first input clock signal CLK_I1 and the second input clock signal CLK_I2 and output a result thereof as the first clock signal C1. For example, as a phase difference between the first input clock signal CLK_I1 and the second input clock signal CLK_I2 corresponds to 90 degrees, the frequency of the first clock signal C1 may be twice the frequency of the first input clock signal CLK_I1 and the frequency of the second input clock signal CLK_I2.

The PLL circuit 330 may change the frequency band of an input clock signal and generate a phase-locked second clock signal C2. For example, the PLL circuit 330 may include a plurality of voltage-controlled oscillators (not shown) for variously changing the frequency band of an input clock, and thus the PLL circuit 330 may generate the second clock signal C2 of various frequencies, e.g., 2 times, 4 times, or 8 times the frequency of an input clock. For example, the PLL circuit 330 may selectively receive any one of the first input clock signal CLK_I1 and the second input clock signal CLK_I2 and generate the second clock signal C2 having a multiplied frequency and a fixed phase. Also, after the phase is fixed, the duty ratio of the second clock signal C2 may have a 50% value.

Figure 5:
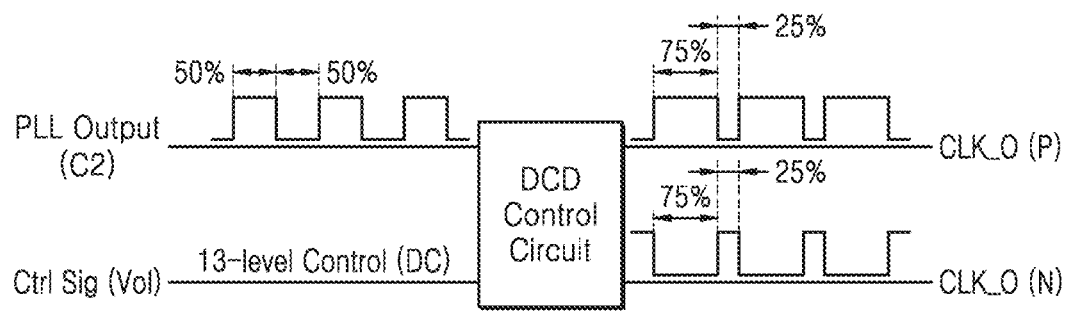

As a circuit for changing the clock characteristics (or frequency characteristics) of an output of the PLL circuit 330, the DCD control circuit 341 may adjust the duty ratio of the second clock signal C2 from the PLL circuit 330. For example, referring to FIG. 5, the DCD control circuit 341 may receive a control signal (or a control voltage) Ctrl sig and may adjust the duty ratio of the second clock signal C2 based on the same. Although FIG. 5 shows an example in which, because the level of a direct current (DC) voltage provided to the DCD control circuit 341 may be adjusted to 13 levels, the duty ratio of the second clock signal C2 is adjusted step-by-step, the example embodiments of the inventive concepts are not necessarily limited thereto, and the control signal (or control voltage) Ctrl sig may be adjusted to various levels. Also, because the level-adjusted control signal Ctrl sig is used as a power voltage, the DCD control circuit 341 may adjust a rising/falling slew rate of the second clock signal C2, thereby generating a signal (a third clock signal C3), which corresponds to the second clock signal C2 with an adjusted duty ratio. For example, the second clock signal C2 includes differential signals, and the DCD control circuit 341 changes output voltages of a positive signal and a negative signal as the differential signals, and thus, the third clock signals C3 having various duty ratios may be generated.

When a memory device is to be tested as a DUT, it may be advantageous to perform a test while changing the duty of a clock signal to perform various tests, such as effective window margin of data during recording and reading of data. According to example embodiments of the inventive concepts, various types of tests may be performed by providing third clock signals C3 having various duty ratios to the DUT.

Figure 6A:
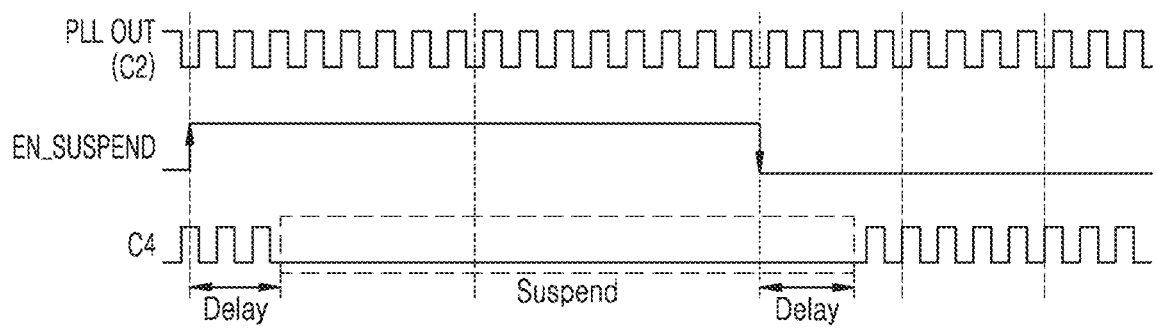

The suspend control circuit 342 may change an input clock from the PLL circuit 330 or the DCD control circuit 341 to a fixed voltage state and output a result thereof. For example, the suspend control circuit 342 may receive the third clock signal C3 from the DCD control circuit 341 and, in response to a suspend enable signal EN_SUSPEND, output a fourth clock signal C4 having a level fixed to a logic high level or a logic low level. For example, the suspend control circuit 342 may generate the fourth clock signal C4 that maintains a particular voltage level during a period in which the suspend enable signal EN_SUSPEND is activated. FIG. 6A exemplifies a characteristic that a clock is deactivated or activated after a predetermined or alternatively, desired delay period after activation and deactivation of the suspend enable signal EN_SUSPEND. Also, FIG. 6A shows an example in which a positive signal of the fourth clock signal C4, which is a differential signal, is maintained at a logic low level, wherein a negative signal (not shown) of the fourth clock signal C4 may maintain a logic high level as the suspend enable signal EN_SUSPEND is activated.

Figure 6B:
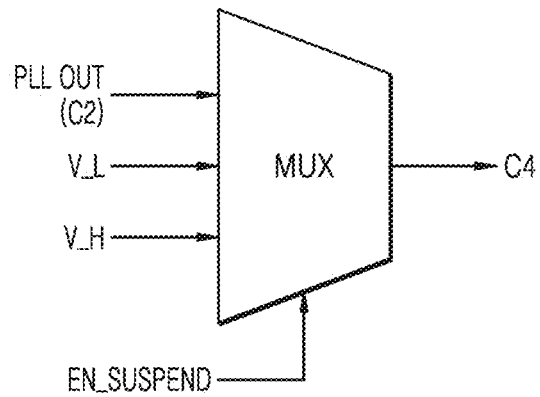

The waveform of the fourth clock signal C4 shown in FIG. 6 may be generated through various circuit implementations, and FIG. 6B shows an example of such implementations. For example, the suspend control circuit 342 may include a selector MUX that receives various clock signals and voltage signals and controls a selection operation, wherein the selector MUX may receive the phase-locked second clock signal C2 from the PLL circuit 330 and at least one voltage signal including a first voltage V_H corresponding to a logic high level and a second voltage V_L corresponding to a logic low level. The selector MUX may output the second clock signal C2 from the PLL circuit 330 as the fourth clock signal C4 and may output any one voltage signal (e.g., the second voltage V_L) during a period in which the suspend enable signal EN_SUSPEND is enabled, thereby outputting a suspended fourth clock signal C4.

A memory device like DRAM does not always receive a clock signal having a predetermined or alternatively, desired frequency from the outside, and it is necessary to deactivate a clock signal input during some periods like a power-down mode or a self-refresh mode. According to example embodiments of the inventive concepts, the suspend control circuit 342 may generate the fourth clock signal C4 including a period in which a clock is deactivated for testing various modes like a power-down mode and a self-refresh mode of a DUT, and a clock signal of which a clock is deactivated during some particular modes as stated above may be provided to a DUT.

Figure 7A:
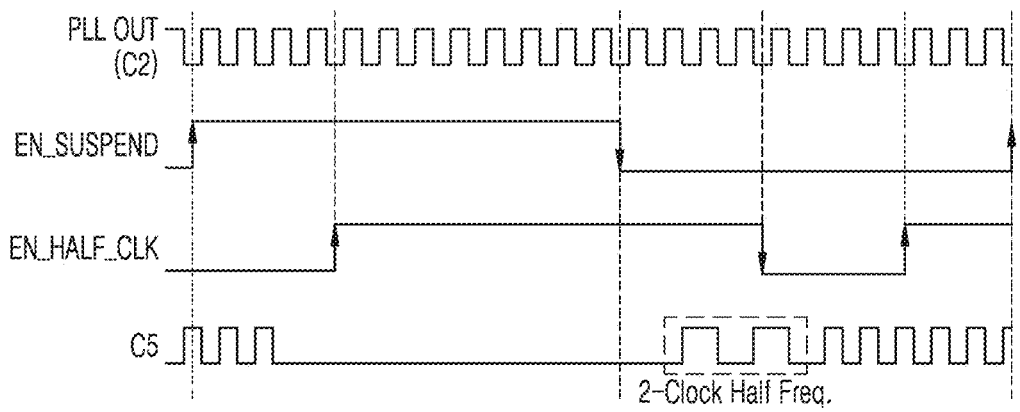

The half clock control circuit 343 may output a fifth clock signal C5 including at least one clock having a frequency in a band half the frequency of a phase-locked output of the PLL circuit 330 through a signal conversion operation on an input clock from the PLL circuit 330 or the suspend control circuit 342. For example, although FIG. 7A shows an example in which the fifth clock signal C5 includes two clocks having frequencies of a band half the band of the frequency of a phase-locked output of the PLL circuit 330, example embodiments of the inventive concepts are not necessarily limited thereto. The frequency band of the clocks of the fifth clock signal C5 may be variously adjusted, and the number of clocks of different frequency bands may also vary.

During an operation of a memory device like mobile DRAM, it may be defined in the specification of the mobile DRAM that the mobile DRAM receives two half clocks before an active operation, a read operation, and a write operation are performed. However, because the frequency of a clock signal having a locked phase from a general PLL circuit is not adjustable, there are limits for using an output of the PLL circuit as a clock signal of a DUT for testing the devices like mobile DRAM. On the other hand, according to example embodiments of the inventive concepts, as the half clock control circuit 343 may generate the fifth clock signal C5 having a waveform corresponding to the specification applied to a memory device like mobile DRAM as a half clock enable signal EN_HALF_CLK is activated, and thus, a clock signal having two half clocks according to the specification applied to a memory device like mobile DRAM may be provided to a DUT.

Referring to FIG. 7A, an example embodiment in which the level of the fifth clock signal C5 in some periods is fixed to a particular level (e.g., a logic low level) as the suspend enable signal EN_SUSPEND is activated is exemplified. Also, an example embodiment in which the two clocks of the fifth clock signal C5 have frequencies in a half band (half clocks) as the half clock enable signal EN_HALF_CLK is enabled is exemplified. For example, the half clock control circuit 343 may include a logic circuit for receiving the fourth clock signal C4 to which suspend activation is applied and for generating the fifth clock signal C5 including a predetermined or alternatively, desired number of half clocks as the half clock enable signal EN_HALF_CLK is activated in a period in which suspend is deactivated. Also, after the predetermined or alternatively, desired number of half clocks are generated, the fifth clock signal C5 may have a frequency corresponding to the second clock signal C2 from the PLL circuit 330.

Figure 7B:
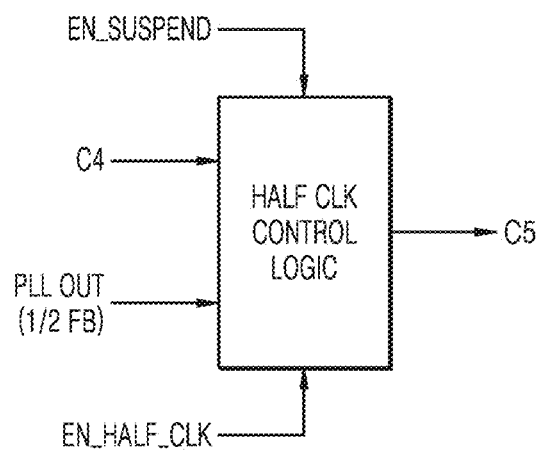

The waveform of the fifth clock signal C5 shown in FIG. 7A may be generated through various circuit implementations, and FIG. 7B shows an example of such implementations. For example, the half clock control circuit 343 may include a half clock control logic for receiving various clock signals and generating the fifth clock signal C5 including one or more half clocks.

The half clock control logic may receive any one of oscillation signals from the fourth clock signal C4 and the PLL circuit 330 from the suspend control circuit 342. For example, the half clock control logic may receive an oscillation signal ½ FB having a frequency band corresponding to half of the frequency band of the phase-locked second clock signal C2 generated by the PLL circuit 330. Also, the half clock control logic may receive the suspend enable signal EN_SUSPEND and the half clock enable signal EN_HALF_CLK.

As the half clock control logic receives the fourth clock signal C4 from the suspend control circuit 342, the half clock control logic may output the fifth clock signal C5 of which the level is fixed during a predetermined or alternatively, desired period and may determine whether to apply a half clock at a timing at which clock is activated again based on the suspend enable signal EN_SUSPEND and/or the half clock enable signal EN_HALF_CLK. For example, the half clock control logic may detect whether the half clock enable signal EN_HALF_CLK is activated at a timing at which the suspend enable signal EN_SUSPEND is deactivated and, when the half clock enable signal EN_HALF_CLK is activated, may output a predetermined or alternatively, desired number of (e.g., two) clocks of the oscillation signal ½ FB of the half frequency band as the fifth clock signal C5. Therefore, the fifth clock signal C5 having the waveform as shown in FIG. 7A may be generated.

As described above, clock signals of which clock characteristics are changed in various ways may be provided as the bypass selector 350, which is a first selector. For example, the bypass selector 350 may receive a first selection signal SEL1 from test logic (not shown) according to the above-described example embodiments and may selectively output one clock signal based on the same. For example, the bypass selector 350 may receive the second clock signal C2 from the PLL circuit 330, on which clock conversion has not been performed, the third clock signal C3 of which the duty characteristic is changed, and the fourth clock signal C4, of which the duty characteristic and the suspend characteristics are changed, and may selectively output any one clock signal.

On the other hand, as a second selector, the output selector 360 may receive a clock signal selected by the bypass selector 350, the fifth clock signal C5 to which duty/suspend/half clock characteristics are applied, and the first clock signal C1 from the XOR circuit 320 and, in response to a second selection signal SEL2 that may be provided from test logic (not shown), may selectively output any one clock signal as the output clock signal CLK_O. Through the selection operation of the bypass selector 350 and the selection operation of the output selector 360 as described above, any one of first to fifth clock signals C1 to C5 may be provided to a DUT as the output clock signal CLK_O, and the clock characteristic of the output clock signal CLK_O provided to the DUT may be variously adjusted.

Figure 3:
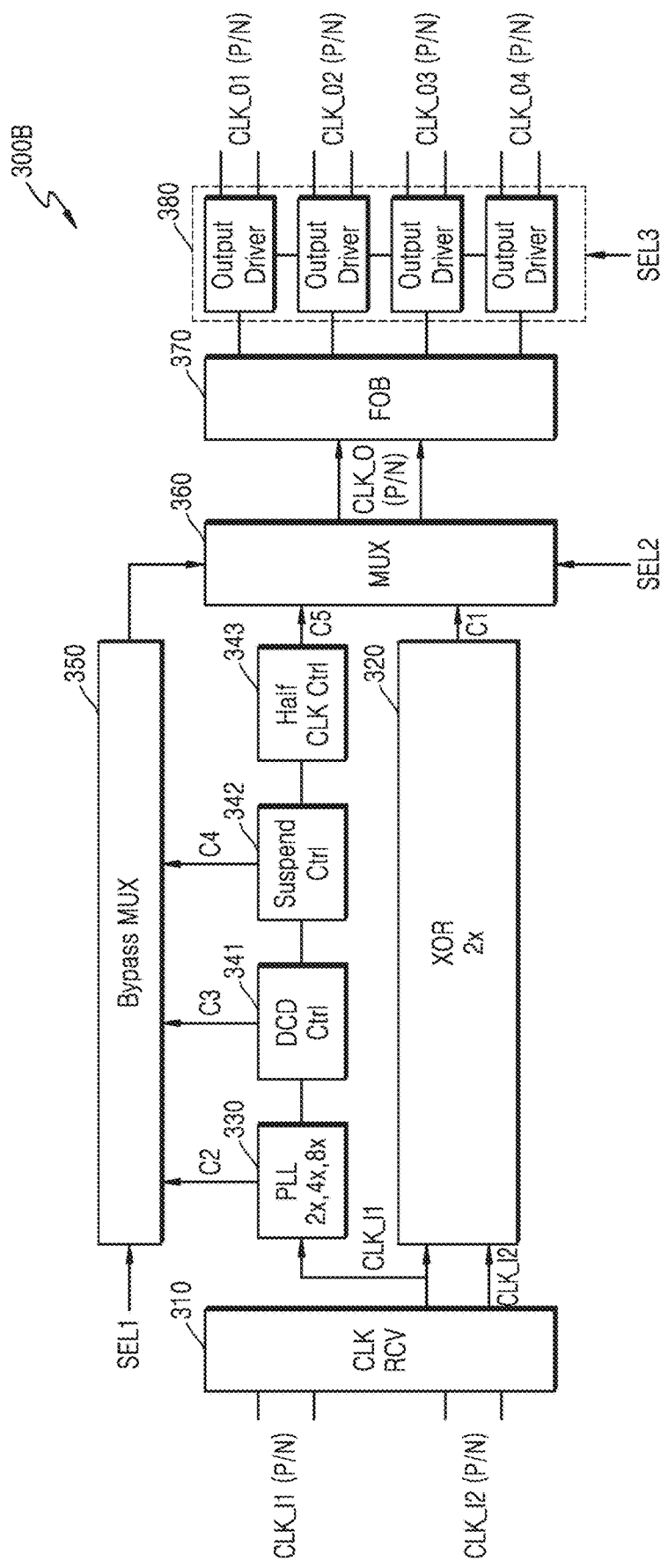
FIG. 3 is a block diagram showing a clock conversion device according to various example embodiments of the inventive concepts.

FIG. 3 is a block diagram showing a clock conversion device according to various example embodiments of the inventive concepts. FIG. 3 shows an example in which output clock signals are provided to a plurality of DUTs as a clock conversion device 300B generates a plurality of output clock signals. In the descriptions of the operation of the clock conversion device 300B according to example embodiments shown in FIG. 3, detailed descriptions of the same components described in the above example embodiments will be omitted.

In addition to various clock generators and clock conversion circuits according to the above example embodiments, the clock conversion device 300B may further include a fan out buffer (FOB) 370 and an output driver circuit 380. The FOB 370 may include a circuit for expanding one output clock signal CLK_O corresponding to a differential signal from the output selector 360 to a plurality of signals. For example, an example embodiment in which the output clock signal CLK_O output from the output selector 360 is expanded to first to fourth output clock signals CLK_O1 to CLK_O4.

The output driver circuit 380 may include one or more output drivers, and each output driver may receive an output clock signal from the FOB 370, amplify the output clock signal, and provide an amplified output clock signal to a DUT. FIG. 3 exemplifies an example embodiment in which, as the FOB 370 generates four output clock signals, the output driver circuit 380 includes four output drivers. Also, in the output driver circuit 380, output drivers to be actually enabled may be selected based on a third selection signal SEL3 from test logic.

According to the above example embodiments, a test board may include a plurality of sockets for mounting DUTs, and each DUT may receive one output clock signal or may receive two or more output clock signals from a test device. According to example embodiments of the inventive concepts, the clock conversion device 300B may be provided in correspondence to one or more sockets (or one or more DUTs), and the first to fourth output clock signals CLK_O1 to CLK_O4 may be provided to different DUTs, respectively. Alternatively, when two output clock signals are provided to each DUT, any two output clock signals from among the first to fourth output clock signals CLK_O1 to CLK_O4 may be provided to one DUT, and the other two output clock signals may be provided to another DUT. Alternatively, some of output drivers of the output driver circuit 380 may be disabled, and it may be determined whether to use the output drivers based on a purpose of using a test device or power consumption supported by the test device.

According to example embodiments of the inventive concepts as described above, for a test of high-speed DRAM like a GDDR and an LPDDR operating in a high-frequency band, a clock conversion device according to the inventive concepts may be provided to a previous test system, thereby utilizing a test device generating clock signals of a relatively low frequency band for testing the high-speed DRAM. For example, even when a test device provides a clock signal having a frequency of the 8 Gbps band, a clock signal having a frequency of the 32 Gbps band or a higher frequency band may be generated through a clock conversion device, and thus, DRAM operating in the 20 Gbps band or a higher frequency band may be tested by using a previous test device. Also, because output clock signals having various clock characteristics may be provided to a DUT through the clock conversion operation according to the above example embodiments, various types of tests may be performed on the DUT.

Figure 8:
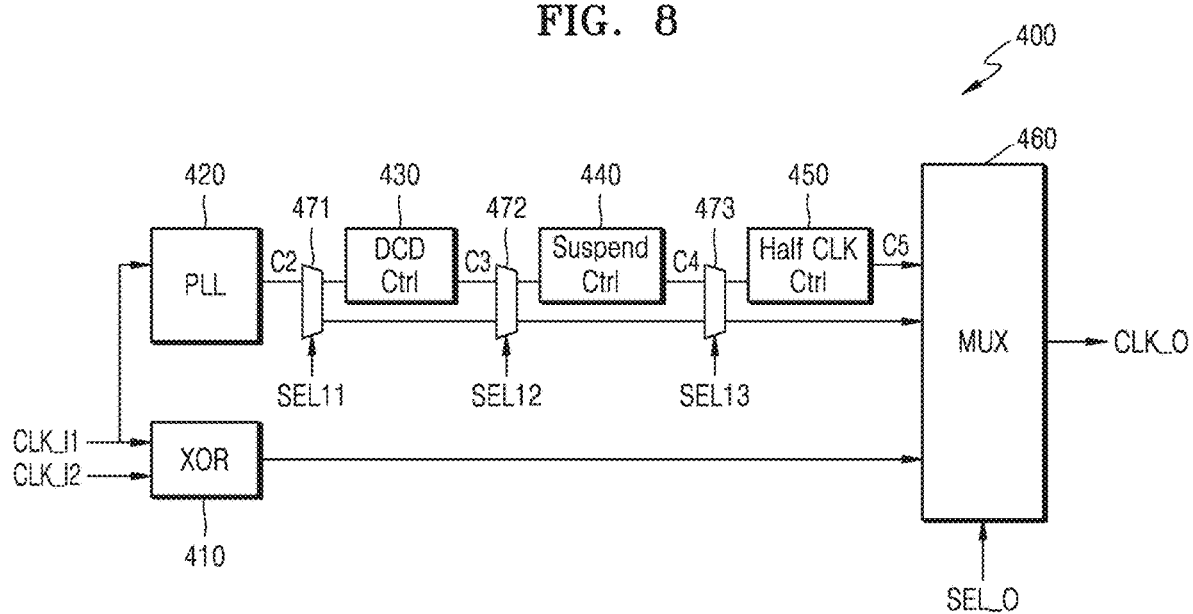
FIGS. 8 and 9 are block diagrams of clock conversion devices that perform selection of output clock signals according to example embodiments of the inventive concepts.
Figure 9:
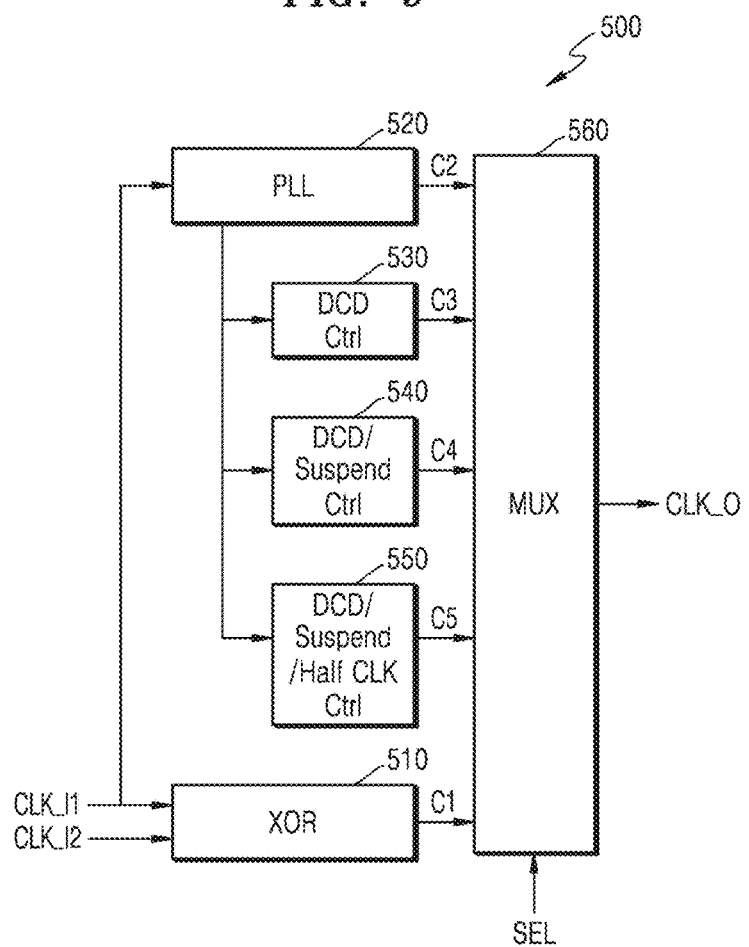

FIGS. 8 and 9 are block diagrams of clock conversion devices that perform selection of output clock signals according to example embodiments of the inventive concepts.

Referring to FIG. 8, a clock conversion device 400 may include an XOR circuit 410, a PLL circuit 420, a DCD control circuit 430, a suspend control circuit 440, a half clock control circuit 450, and/or a selector (hereinafter, referred to as an output selector) 460. The output selector 460 may perform a selection operation in response to the output selection signal SEL__O from a test device (not shown). Also, according to example embodiments of the inventive concepts, the clock conversion device 400 may further include first to third selectors 471 to 473 that operate in response to first to third selection signals SEL11 to SEL13 as additional selectors for selecting outputs of various clock signals with changed clock characteristics. Also, although not shown in FIG. 8, according to the above example embodiments, the clock conversion device 400 may further include various other components related to generation and provision of an output clock signal like a clock receiver and an output driver circuit.

According to the above example embodiments, the XOR circuit 410 may receive the first input clock signal CLK_I1 and the second input clock signal CLK_I2, generate the first clock signal C1 of which the frequency is increased twice through an XOR calculation process, and provide the first clock signal C1 to the output selector 460. Also, the PLL circuit 420 may receive the first input clock signal CLK_I1 and generate the second clock signal C2 with a multiplied frequency and a locked phase. When an output of the PLL circuit 420 is provided to a DUT without adjusting the clock characteristic, the second clock signal C2 may be provided to the output selector 460 as the output clock signal CLK_O according to selection operations of the first to third selectors 471 to 473 and the output selector 460.

When an output clock signal is provided to a DUT by changing the clock characteristic of an output of the PLL circuit 420 according to the above example embodiments, the second clock signal C2 may be provided to the DCD control circuit 430 according to a selection operation of a first selector 471. For example, when an output clock signal is provided to a DUT by adjusting the duty ratio of an output of the PLL circuit 420, the third clock signal C3 from the DCD control circuit 430 may be provided to the output selector 460 according to selection operations of second and third selectors 472 and 473.

Alternatively, when suspend is applied to an output of the PLL circuit 330, the second clock signal C2 may be provided to the suspend control circuit 440 or the third clock signal C3 may be provided to the suspend control circuit 440 according to selection operations of first and second selectors 471 and 472. For example, when both adjustment of a duty ratio and suspend are applied to an output of the PLL circuit 330, the third clock signal C3 from the DCD control circuit 430 may be provided to the suspend control circuit 440. On the contrary, when only suspend is applied to an output of the PLL circuit 330, the second clock signal C2 from the PLL circuit 330 may be provided to the suspend control circuit 440.

The fourth clock signal C4 output from the suspend control circuit 440 may be provided to the half clock control circuit 450 or the output selector 460 through a third selector 473. Also, the fifth clock signal C5 including clocks of which frequencies decreased by the half clock control circuit 450 may be provided to the output selector 460.

Test logic (not shown) provided in a test device may provide the output selection signal SEL__O to the output selector 460, thereby providing various clock characteristics for the output clock signal CLK_O provided to a DUT. For example, the first clock signal C1 of which the frequency is increased by twice may be provided from the XOR circuit 410 to a DUT as the output clock signal CLK_O, the phase-locked second clock signal C2 of which the frequency is increased by various multiples may be provided from the PLL circuit 420 to the DUT as the output clock signal CLK_O, or a signal generated by changing at least one clock characteristic of the second clock signal C2 may be provided to the DUT as the output clock signal CLK_O.

FIG. 9 is a diagram showing an example in which an output selector receives a plurality of output clock signals and performs a selection operation thereon.

Referring to FIG. 9, a clock conversion device 500 may include an XOR circuit 510, a PLL circuit 520, a DCD control circuit 530, a DCD/suspend control circuit 540, a DCD/suspend/half clock control circuit 550, and/or an output selector 560. In the example shown in FIG. 9, example embodiments of the inventive concepts may include a circuit to which only a suspend is applied, a circuit to which only a half clock is applied, and clock conversion circuits with various other possible combinations, but detailed illustrations thereof are omitted for convenience of explanation.

According to the above example embodiments, the XOR circuit 510 may receive the first input clock signal CLK_I1 and the second input clock signal CLK_I2 and generate the first clock signal C1, and the PLL circuit 520 may receive the first input clock signal CLK_I1 and generate the phase-locked second clock signal C2. Also, the second clock signal C2 from the PLL circuit 520 may be provided in common to the DCD control circuit 530, the DCD/suspend control circuit 540, and the DCD/suspend/half clock control circuit 550. The output selector 560 may receive the first clock signal C1 from the XOR circuit 510, the second clock signal C2 from the PLL circuit 520, and the third clock signal C3 from the DCD control circuit 530. Also, the output selector 560 may further receive the fourth clock signal C4 generated by applying a duty ratio change and a suspend conversion on an output of the PLL circuit 520 from the DCD/suspend control circuit 540 and the fifth clock signal C5 generated by applying a duty ratio change, a suspend conversion, and a half clock conversion on an output of the PLL circuit 520 from the DCD/suspend/half clock control circuit 550.

The output selector 560 may receive the output selection signal SEL__O from test logic (not shown) and selectively output any one of the first to fifth clock signals C1 to C5. According to the above example embodiments shown in FIG. 9, the number of switching operations for various clock signals may be reduced, and delay characteristics of a clock signal associated with a switching operation of a selector may be improved.

The examples of implementation of the clock conversion device shown in FIGS. 8 and 9 are merely examples, and a clock conversion device according to example embodiments of the inventive concepts may be implemented in various other forms as long as frequency characteristics of an output clock signal provided to a DUT may be variously changed.

Figure 10:
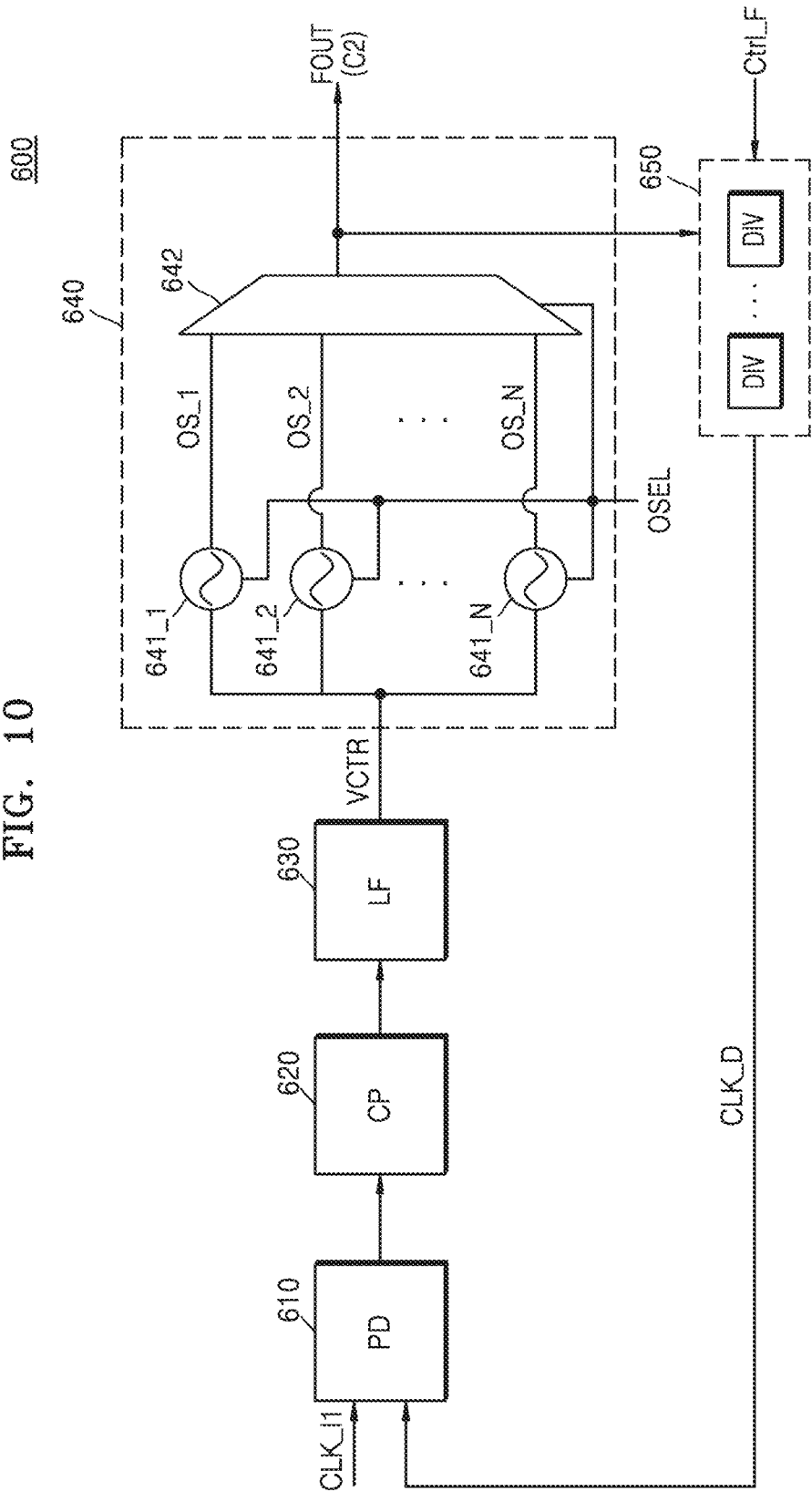
FIG. 10 is a diagram showing an example implementation of a phase locked loop (PLL) circuit according to example embodiments of the inventive concepts.

FIG. 10 is a diagram showing an example implementation of a PLL circuit according to example embodiments of the inventive concepts.

Referring to FIG. 10, a PLL circuit 600 may include a phase detector 610, a charge pump 620, a loop filter 630, a voltage-controlled oscillator 640, and/or a divider 650. The phase detector 610 may compare the phase of the first input clock signal CLK_I1 with the phase of a clock signal CLK_D provided as feedback from the divider 650, the charge pump 620 may generate a signal according to a difference between the phases thereof, the loop filter 630 may convert a signal from the charge pump 620 into a voltage signal VCTR, and the voltage-controlled oscillator 640 may output an oscillation signal according to a voltage signal VCTR.

According to example embodiments, the voltage-controlled oscillator 640 may include a plurality of oscillation circuits (e.g., first to N-th oscillation circuits 641_1 to 641_N), wherein the first to N-th oscillation circuits 641_1 to 641_N may output oscillation signals OS__1 to OS__N having different frequency bands. Also, to select the frequency band of a signal output from the PLL circuit 600, any one of the first to N-th oscillation circuits 641_1 to 641_N may be selected in response to an oscillation selection signal OSEL from a test device (not shown. Also, a selector 642 may provide an oscillation signal FOUT output from a selected oscillation circuit as an output of the PLL circuit 600. Although FIG. 10 shows example embodiments in which the oscillation selection signal OSEL is provided to both the first to N-th oscillation circuits 641_1 to 641_N and the selector 642, the oscillation selection signal OSEL may also be provided only to the first to N-th oscillation circuits 641_1 to 641_N or only to the selector 642. Also, the PLL circuit 600 may provide the oscillation signal FOUT as the second clock signal C2.

Also, as the PLL circuit 600 generates oscillation signals FOUT of various frequencies, the divider 650 may include a plurality of division circuits. For example, each division circuit may divide the frequency of an input signal by N (e.g., divide by 2). The divider 650 may generate signals by dividing the oscillation signal FOUT by various values and, depending on the number of division circuits applied during a division operation, may provide signals having the same frequency as the oscillation signal FOUT or signals generated by dividing the oscillation signal FOUT by various values as clock signals CLK_D provided as feedback. According to example embodiments, the divider 650 may adjust the frequency of the clock signal CLK_D provided as feedback, in response to a frequency control signal Ctrl_F.

According to example embodiments of the inventive concepts, the first to N-th oscillation circuits 641_1 to 641_N may generate oscillation signals having frequencies of various bands. For example, the first oscillation circuit 641_1 may generate an oscillation signal having a frequency band that is 1 time (or the same as) the frequency band of the first input clock signal CLK_I1, the second oscillation circuit 641_2 may output an oscillation signal having a frequency band twice the frequency band of the first input clock signal CLK_I1, and the other oscillation circuits may output oscillation signals having various frequency bands, e.g., a frequency band that is 4 times the frequency band of the first input clock signal CLK_I1, a frequency band that is 8 times the frequency band of the first input clock signal CLK_I1, etc.

Figure 11:
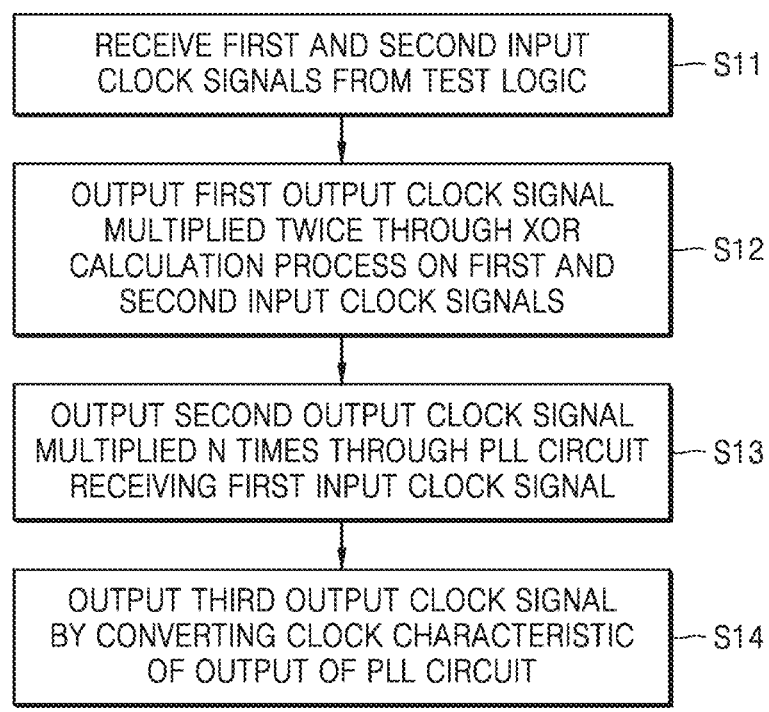
FIG. 11 is a flowchart of a method of operating a test system according to example embodiments of the inventive concepts.

FIG. 11 is a flowchart of a method of operating a test system according to example embodiments of the inventive concepts. Operations in the example embodiments shown in FIG. 11 may correspond to operations of a test board or a clock conversion device mounted in the test board.

Referring to FIG. 11, DUTs are mounted to a plurality of sockets arranged on the test board, and a clock conversion device according to example embodiments of the inventive concepts may receive first and second input clock signals from test logic of a test device (operation S11) and output output clock signals used to test DUTs.

For example, the clock conversion device may perform a calculation process for the first and second input clock signals from the test device. For example, the clock conversion device may output a first output clock signal generated by multiplying the frequency thereof by twice (×2) through an XOR calculation process for the first and second input clock signals to a DUT (operation S12).

Also, the clock conversion device may include a PLL circuit for receiving a first input clock signal from the test device and output a second output clock signal of which the frequency is multiplied N times (×N) through the PLL circuit to a DUT (operation S13). Therefore, the test system may provide a phase-locked and frequency-multiplied output clock signal to a DUT, and thus a DUT operating at a higher speed may be tested.

Also, the clock conversion device may include a clock conversion circuit for converting the clock characteristic of an output from the PLL circuit according to the above example embodiments and may output a third output clock signal generated by converting the clock characteristic of the output from the PLL circuit to a DUT (operation S14). Therefore, the test system may change clock characteristics of an output clock signal and provide an output clock signal with changed clock characteristics to perform various types of tests on a DUT.

Figure 12:
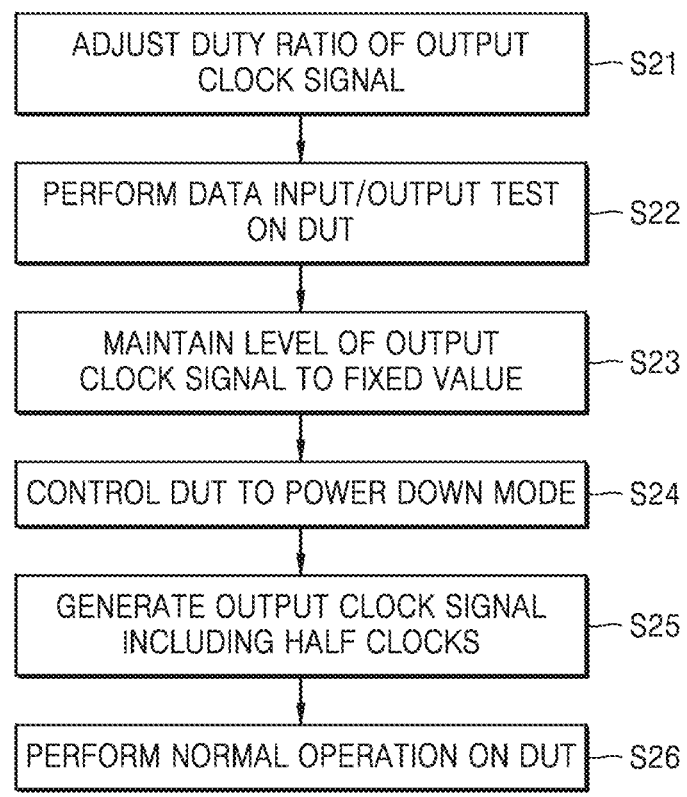
FIG. 12 is a flowchart of a method of operating a test system according to other example embodiments of the inventive concepts.

FIG. 12 is a flowchart of a method of operating a test system according to other example embodiments of the inventive concepts. In FIG. 12, it is assumed that a DUT includes a memory device.

Referring to FIG. 12, according to the above example embodiments, a clock conversion device may include a PLL circuit and may include circuit blocks for performing various clock conversion processes on an output of the PLL circuit. For example, the clock conversion device may provide an output clock signal to a DUT by converting the clock characteristic of an output from the PLL circuit. For example, the clock conversion device may adjust the duty ratio of an output clock signal (operation S21).

The clock conversion device may provide an output clock signal with an adjusted duty ratio to a DUT, and a test system may perform a data input/output test on the DUT based on the output clock signal provided to the DUT (operation S22). For example, an operation for testing margin characteristics between write data provided to a DUT and read data received from the DUT may be performed. In some example embodiments, a data input/output data on the DUT may be performed while adjusting the duty ratio of an output clock signal. According to the above example embodiments, a duty ratio may be differently adjusted through a multi-stage control on a DCD control circuit, and output clock signals having various duty ratios may be provided to the DUT.

The clock conversion device may maintain the level of an output clock signal at a fixed value corresponding to a logic high level or a logic low level (operation S23) and may provide an output clock signal of which the level is maintained at a fixed value for a predetermined or alternatively, desired period to the DUT. The test system may drive DUTs in various modes during a test operation on the DUTs. For example the test system may drive a DUT in a power down mode (operation S24).

Operations like a normal write operation or read out operation may be performed on a DUT during a test process, and an output clock signal having a predetermined or alternatively, desired clock characteristic needs to be provided to the DUT before the DUT actually performs a normal write operation or a read out operation. For example, when a test is performed on mobile DRAM, a predetermined or alternatively, desired number of half clocks having the frequency half the driving frequency of an actual DUT needs to be provided to the DUT, and, according to the above example embodiments, the clock conversion device may generate an output clock signal including half clocks by changing clock characteristics of an output of the PLL circuit (operation S25). Therefore, the test system may perform a test by performing a normal operation on the DUT (operation S26).

Figure 13A:
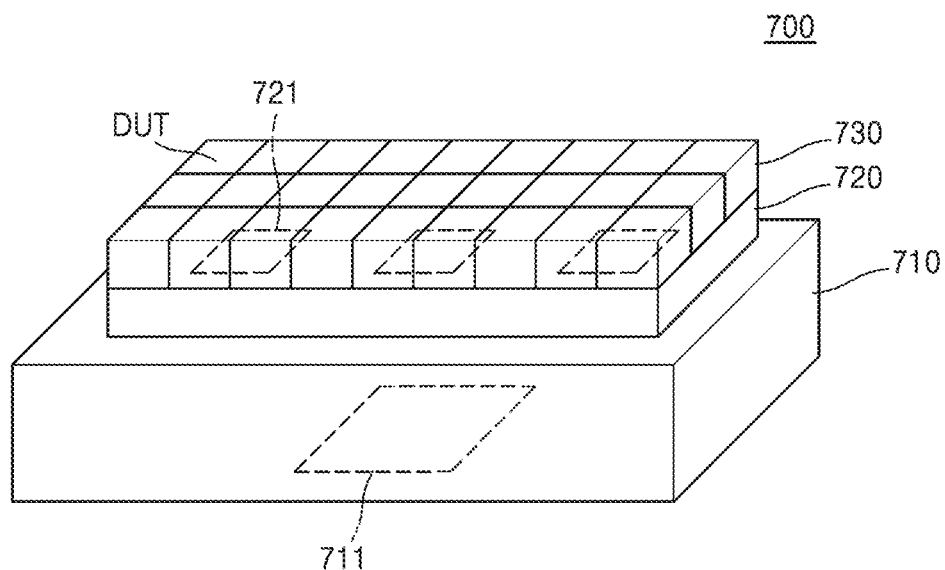
FIGS. 13A and 13B are a block diagram and a structure diagram showing an example in which a clock conversion chip is provided in correspondence to a plurality of devices under test (DUTs).
Figure 13B:
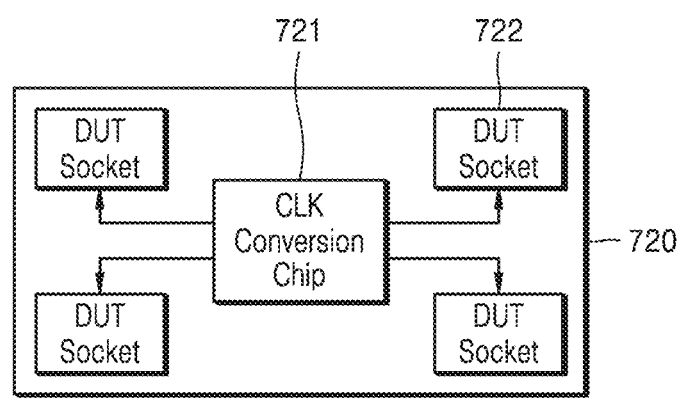

FIGS. 13A and 13B are a block diagram and a structure diagram showing an example in which a clock conversion chip is provided with reference to a plurality of DUTs.

Referring to FIG. 13A, a test system 700 may include a test device 710 and a test board 720, and the test device 710 may include test logic. Also, the test board 720 may include one or more clock conversion chips 721, wherein the clock conversion chip 721 may correspond to a clock conversion device in the above example embodiments. Also, the test board 720 may include a plurality of sockets, and a plurality of DUTs 730 may be mounted to the sockets. The test system 700 may be referred to as automatic test equipment (ATE).

In addition, FIG. 13B shows an example in which the test board 720 includes the clock conversion chip 721 and sockets 722, wherein the clock conversion chip 721 is provided in correspondence to four sockets 722. According to the above example embodiments, each clock conversion chip 721 may generate a plurality of output clock signals, and the output clock signals may be provided to one or more DUTs. Although FIG. 13B shows that the clock conversion chip 721 provides output clock signals to DUTs mounted to the four sockets 722, the arrangement of the clock conversion chip 721 and the sockets 722 on the test board 720 may vary. One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A clock conversion device comprising:
    a first clock generator configured to receive a first input clock signal from test logic and generate a first clock signal of which a frequency is multiplied and a phase is locked;
    a clock conversion circuit configured to receive the first clock signal and generate one or more second clock signals by converting at least one clock characteristic of the first clock signal; and
    an output selector configured to output any one of the first clock signal and the one or more second clock signals as an output clock signal,
    wherein the clock conversion device is configured to provide the output clock signal to a device under test (DUT).

2. The clock conversion device of claim 1,
    further comprising a second clock generator configured to receive the first input clock signal and a second input clock signal from the test logic and generate a third clock signal of which a frequency is multiplied through a calculation process on the first input clock signal and the second input clock signal.

3. The clock conversion device of claim 2,
    wherein the first input clock signal and the second input clock signal have a phase difference of 90 degrees from each other, and
    the second clock generator comprises an exclusive OR (XOR) circuit that performs an XOR calculation on the first input clock signal and the second input clock signal.

4. The clock conversion device of claim 1,
    wherein the first clock generator comprises a phase locked loop (PLL) circuit configured to receive the first input clock signal and generate the first clock signal of which the frequency is multiplied and the phase is locked.

5. The clock conversion device of claim 4,
    wherein the PLL circuit comprises a plurality of voltage-controlled oscillators configured to multiply the frequency of the first input clock signal by different multiples, and,
    in response to a selection signal from the test logic, an oscillation signal output from any one of the plurality of voltage-controlled oscillators is provided as the first clock signal.

6. The clock conversion device of claim 4,
    wherein the clock conversion circuit comprises a duty cycle distortion (DCD) control circuit configured to receive the first clock signal and adjust a duty ratio of the first clock signal, and the one or more second clock signals comprise a clock signal output from the DCD control circuit.

7. The clock conversion device of claim 6, wherein the clock conversion circuit further comprises a suspend control circuit configured to receive the first clock signal or a clock signal from the DCD control circuit and maintain a level of the first clock signal or the clock signal from the DCD at a logic high level or a logic low level for some periods, and the one or more second clock signals further comprise a clock signal output from the suspend control circuit.

8. The clock conversion device of claim 7, wherein the clock conversion circuit further comprises a half clock control circuit configured to receive the first clock signal or a clock signal from the suspend control circuit and generate a clock signal comprising at least one clock with a reduced frequency, and the one or more second clock signals further comprise a clock signal output from the half clock control circuit.

9. The clock conversion device of claim 1, further comprising a bypass selector configured to transmit the first clock signal from the first clock generator, wherein the output selector is further configured to receive the first clock signal transmitted through the bypass selector and at least one second clock signal provided from the clock conversion circuit and provide any one of received signals as the output clock signal.

10. The clock conversion device of claim 1, further comprising:
a fan out buffer configured to expand the output clock signal output from the output selector into N output clock signals; and
an output driver circuit, which comprises N output drivers arranged in correspondence to the N output clock signals and outputs the N output clock signals to the DUT (here, N is an integer equal to or greater than 2).

11. A test system comprising:
a plurality of sockets to which a plurality of devices under test (DUTs) are mounted; and
a clock conversion device configured to generate output clock signals to be provided to the DUTs, convert clock characteristics of the output clock signals, and output the output clock signals,
wherein the clock conversion device comprises:
a first clock generator configured to receive a first input clock signal and a second input clock signal from the outside and generate a first clock signal with a multiplied frequency through a calculation process on the first input clock signal and the second input clock signal;
a second clock generator configured to receive the first input clock signal and generate a second clock signal of which a frequency is multiplied and a phase is locked;
a clock conversion circuit configured to receive the second clock signal and generate one or more third clock signals by converting at least one clock characteristic of the second clock signal; and
an output selector configured to output any one of the first clock signal, the second clock signal, and the one or more third clock signals as the output clock signal.

12. The test system of claim 11, further comprising a test device comprising test logic for controlling a test operation on the DUTs, wherein the clock conversion device receives the first input clock signal and the second input clock signal from the test device.

13. The test system of claim 12, wherein the test logic provides data to be used for the test operation to the DUTs, and the output clock signal is a signal used by the DUTs to receive the data.

14. The test system of claim 11, wherein the first input clock signal and the second input clock signal have a phase difference of 90 degrees from each other, and the second clock generator comprises an exclusive OR (XOR) circuit that performs an XOR calculation on the first input clock signal and the second input clock signal.

15. The test system of claim 11, wherein the second clock generator comprises a phase locked loop (PLL) circuit configured to receive the first input clock signal and generate the second clock signal of which the frequency is multiplied and the phase is locked.

16. The test system of claim 15, wherein the clock conversion circuit comprises a duty cycle distortion (DCD) control circuit configured to receive the second clock signal and adjust a duty ratio of the second clock signal, and the one or more third clock signals comprise a clock signal output from the DCD control circuit.

17. The test system of claim 16, wherein the clock conversion circuit further comprises a suspend control circuit configured to receive the second clock signal or a clock signal from the DCD control circuit and maintain a level of the first clock signal or the clock signal at a logic high level or a logic low level for some periods, and the one or more third clock signals further comprise a clock signal output from the suspend control circuit.

18. The test system of claim 17, wherein the clock conversion circuit further comprises a half clock control circuit configured to receive the second clock signal or a clock signal from the suspend control circuit and generate a clock signal comprising at least one clock with a reduced frequency, and the one or more third clock signals further comprise a clock signal output from the half clock control circuit.

19. A method of operating a test system comprising a clock conversion device configured to provide an output clock signal to a device under test (DUT), the method comprising:
performing a first test operation by providing a first clock signal, of which a frequency is multiplied and a phase is locked by the clock conversion device, to the DUT as the output clock signal;
performing a second test operation by providing a second clock signal generated by the clock conversion device by adjusting a duty ratio of the first clock signal to the DUT as the output clock signal; and
performing a third test operation by providing a third clock signal generated by the clock conversion device by maintaining a level of the first clock signal or the second clock signal at a fixed level for some periods to the DUT as the output clock signal.

20. The method of claim 19, wherein a data write operation and a data read operation are performed on the DUT by providing the first clock signal to the DUT during the first test operation, an operation of testing an effective margin of data is performed by providing the second clock signal to the DUT in the second test operation, and a test is performed on the DUT in a power down mode or a self-refresh mode of the DUT by providing the third clock signal to the DUT in the third test operation.

\* \* \* \* \*